(12) United States Patent
Mantiply

(10) Patent No.: US 9,035,714 B2
(45) Date of Patent: May 19, 2015

(54) PARASITIC CAPACITANCE COMPENSATING TRANSMISSION LINE

(75) Inventor: Paul L. Mantiply, Mountain Veiw, CA (US)

(73) Assignee: Cisco Technology, Inc., San Jose, CA (US)

( * ) Notice: Subject to any disclaimer, the term of this patent is extended or adjusted under 35 U.S.C. 154(b) by 311 days.

(21) Appl. No.: 13/540,965

(22) Filed: Jul. 3, 2012

(65) Prior Publication Data

US 2014/0009242 A1    Jan. 9, 2014

(51) Int. Cl.
*H03H 7/38* (2006.01)
*H05K 1/02* (2006.01)
*H01L 23/64* (2006.01)

(52) U.S. Cl.
CPC .............. *H05K 1/025* (2013.01); *H01L 23/642* (2013.01); *H03H 7/38* (2013.01)

(58) Field of Classification Search
USPC ....................................... 333/33, 32
See application file for complete search history.

(56) References Cited

U.S. PATENT DOCUMENTS

| | | | |
|---|---|---|---|
| 3,662,294 A | | 5/1972 | Jacobs et al. |
| 5,467,063 A | * | 11/1995 | Burns et al. .................... 333/125 |
| 5,477,089 A | * | 12/1995 | Porter ........................... 307/10.1 |
| 5,770,950 A | | 6/1998 | Zurcher et al. |
| 7,230,835 B1 | | 6/2007 | Ahmad |
| 2004/0125526 A1 | | 7/2004 | Nagode et al. |
| 2007/0222533 A1 | | 9/2007 | Lai et al. |

OTHER PUBLICATIONS

Galal, et al., "Broadband ESD Protection Circuits in CMOS Technology," IEEE Journal on Solid-State Circuits, vol. 38, No. 12, pp. 2334-2340, Dec. 2003.
International Search Report and Written Opinion in counterpart International Application No. PCT/US2013/046507, mailed Oct. 10, 2013, 10 pages.

* cited by examiner

*Primary Examiner* — Stephen E Jones
*Assistant Examiner* — Scott S Outten
(74) *Attorney, Agent, or Firm* — Edell, Shapiro & Finnan, LLC

(57) ABSTRACT

A transmission line is provided in which a first portion of the transmission line is configured to be connected to a source, and a second portion of the transmission line is configured to be connected to a load. A capacitive element is coupled to the transmission line and is configured to compensate for an impedance difference between the load and at least one of the source or the transmission line, at a frequency within a frequency bandwidth of the load. A difference between an internal capacitance of the first portion of the transmission line and the second portion of the transmission line substantially matches the capacitance of the capacitive element.

25 Claims, 6 Drawing Sheets

PARASITIC CAPACITANCE COMPENSATING TRANSMISSION LINE

TECHNICAL FIELD

The present disclosure relates to high speed signal transmission lines, and in particular, transmission lines for high speed broadband receivers and interfaces.

BACKGROUND

As operating frequencies of high speed interfaces increase, the input parasitic capacitance of the high frequency circuit elements must scale inversely with the increase in frequency to maintain an acceptable return loss and to avoid deteriorating insertion loss. In fact, certain industry standards mandate specific levels of return loss and insertion loss that may be difficult to maintain with standard circuit element and transmission line design. Furthermore, it may be difficult to sufficiently miniaturize input structures, such as electro-static discharge protection diodes and their associated parasitic capacitance, while maintaining sufficient electro-static discharge protection.

On-die spiral inductors have been used to compensate for parasitic input capacitance. Unfortunately, spiral inductors are relatively large in size, and the space they occupy on dies significantly hinders the design of sufficiently small circuit elements. Furthermore, other techniques for improving return loss, such as microwave matching techniques, may only be effective over a narrow frequency band.

DESCRIPTION OF EXAMPLE EMBODIMENTS

Overview

According to embodiments set forth herein, a transmission line is provided in which a first portion of the transmission line is configured to be connected to a source, and a second portion of the transmission line is configured to be connected to a load. A capacitive element is coupled to the transmission line and is configured to compensate for an impedance difference between the load and at least one of the source or the transmission line, at a frequency within the frequency bandwidth of the load. A difference between an internal capacitance of the first portion of the transmission line and the second portion of the transmission line substantially matches the capacitance of the capacitive element.

Example Embodiments

Figure 1:
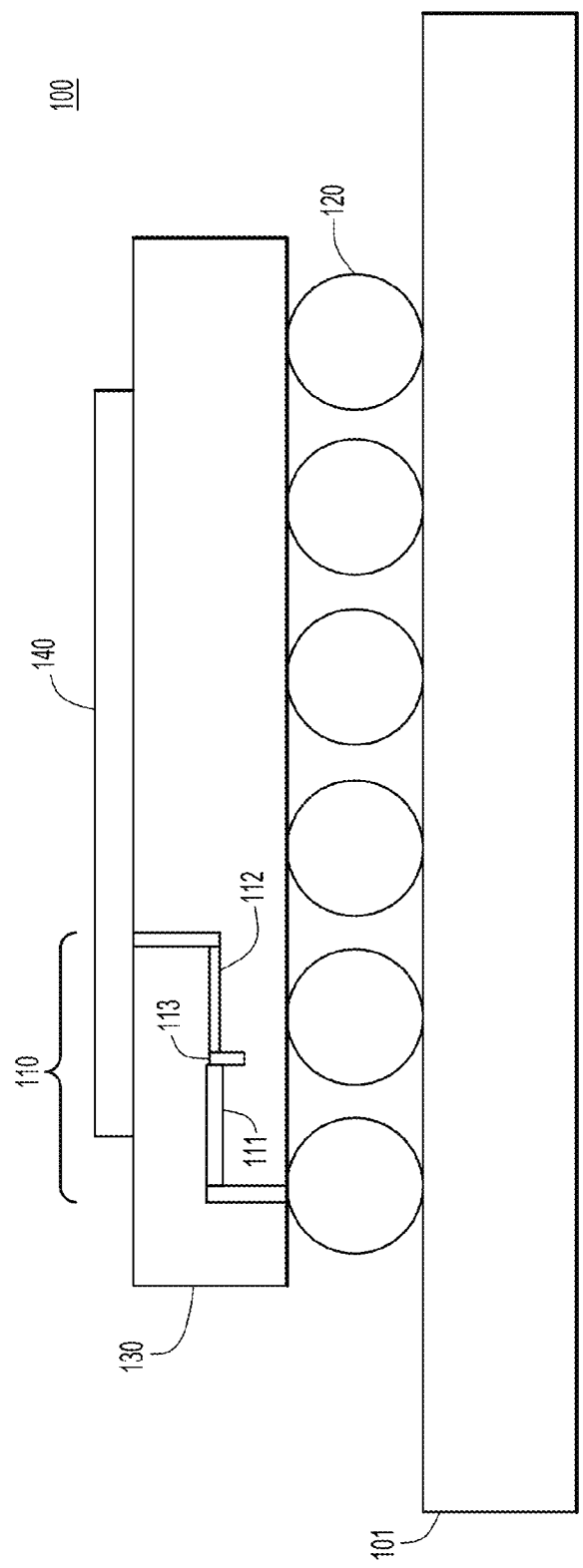
FIG. 1 illustrates an example transmission line for use between a printed circuit board and a die.

Reference is first made to FIG. 1. FIG. 1 illustrates an example circuit 100 which includes an example transmission line 110. Signals are transmitted from printed circuit board 101, through solder 120, to transmission line 110. Transmission line 110, in turn, transmits the signals through the package substrate 130 to circuit elements on die 140. The transmission line comprises a first portion 111, a second portion 112, and a capacitive element 113. Unlike on-die spiral inductors, the example transmission line 110 is implemented within the package substrate 130, and therefore, the transmission line 110 does not consume valuable silicon real estate.

Capacitive element 113 is selected to match an impedance difference between a load located at die 140, and a source connected to the transmission line 110 through circuit board 101. The impedance difference may also take into account the impedance of the solder 120. The first portion 111 and second portion 112 are configured such that an internal capacitance of the first portion 111 is substantially equal to the capacitance of the capacitive element 113 added to the internal capacitance of second portion 112, all of which will be described in greater detail below with reference to FIG. 2.

The transmission line 110 may transmit a broadband or baseband signal between the package substrate 130 and the die 140. A baseband signal has a frequency range from a lower frequency limit determined by the digital encoding scheme up to the Nyquist frequency and does not have a carrier frequency associated with it. Unlike narrowband signaling, which utilizes a single carrier frequency that is modulated within a narrow band, a broadband signal may utilize multiple carrier frequencies to send multiple channels within the broadband frequency bandwidth.

Figure 2:
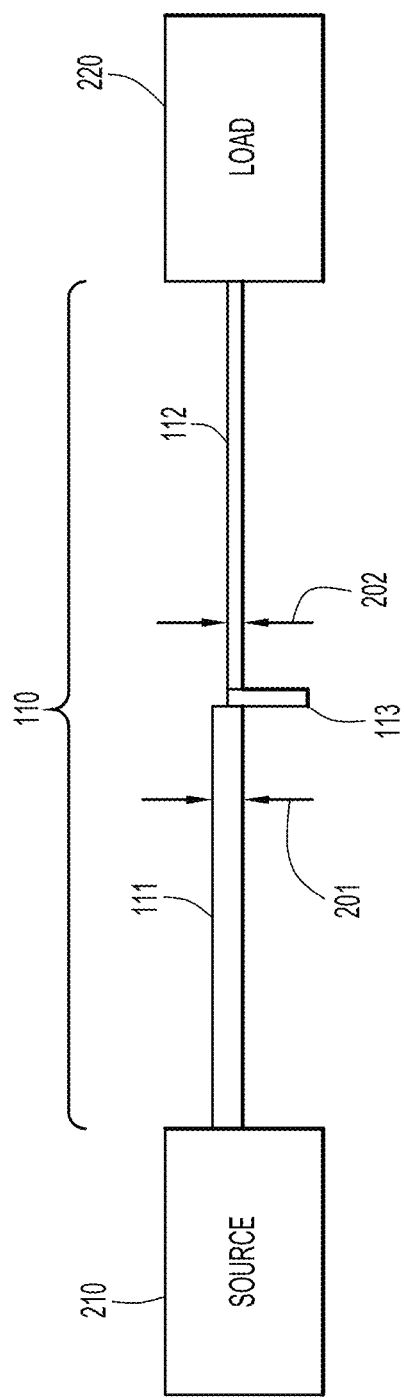
FIG. 2 illustrates an example transmission line for use between a source and a load.

Turning now to FIG. 2, a diagram is shown that is similar to FIG. 1, but the printed circuit board has been generalized to a source 210, and the die has been generalized to a load 220. The transmission line 110 is used to transmit signals between the source 210 and the load 220 within a frequency bandwidth of the load 220. An impedance difference occurs between the load 220 and at least one of the source 210 or the transmission line 110. Accordingly, capacitive element 130 is coupled to the transmission line 110, and a value for the capacitive element 130 is selected in order to compensate for the impedance difference at frequencies within the frequency bandwidth of the load, including frequencies greater than and equal to the Nyquist frequency.

Additionally, the first portion 111 and the second portion 112 are configured such that a difference between an internal capacitance of the first portion 111 and the second portion 112 is equal to a capacitance of the capacitive element 130.

The difference between the internal capacitance of the first portion 111 and the second portion 112 may be created by configuring the first portion 111 and second portion 112 to differ in at least one physical dimension. For example, in FIG. 2, the first portion 111 of the transmission line 110 comprises a first width 201, and the second portion 112 of the transmission line 110 comprises a second width 202. The difference between the first width 201 and the second width 202 creates a difference between the internal capacitance of the first portion 111 and the internal capacitance of the second portion 112 of the transmission line 130. For example, the first portion 111 of the transmission line 110 may be constructed with a standard width which exhibits a standard characteristic impedance for a specific interface or transmission technology. The second portion 112, on the other hand, may have a width 202 such that the internal capacitance of the second portion 112 plus the capacitance of the capacitive element 130 matches the internal capacitance of first portion 111. As depicted in FIG. 2, the width 202 of second portion 112 is made smaller than the standard width 201 of first portion 111 so that when the capacitance of capacitive element 130 is added to the internal capacitance of second portion 112, the combined capacitance matches that of first portion 111.

By changing the internal capacitance of the second portion 112, the inclusion of the capacitive element 130 no longer results in a discontinuity at high frequencies, substantially eliminating reflection and noise that would result if the internal capacitance of the second portion 112 added to the capacitance of the capacitive element 130 did not match the internal capacitance of the first portion 111.

The capacitive element 130 depicted in FIG. 2 may be embodied as a transmission line stub, and is located at a transition between the first portion 111 and second portion 112 of the transmission line 110. Alternatively, the capacitive element may be coupled elsewhere along the second portion 112 of the transmission line 110 in order to meet the performance and manufacturing requirements for the transmission line 110.

Figure 3:
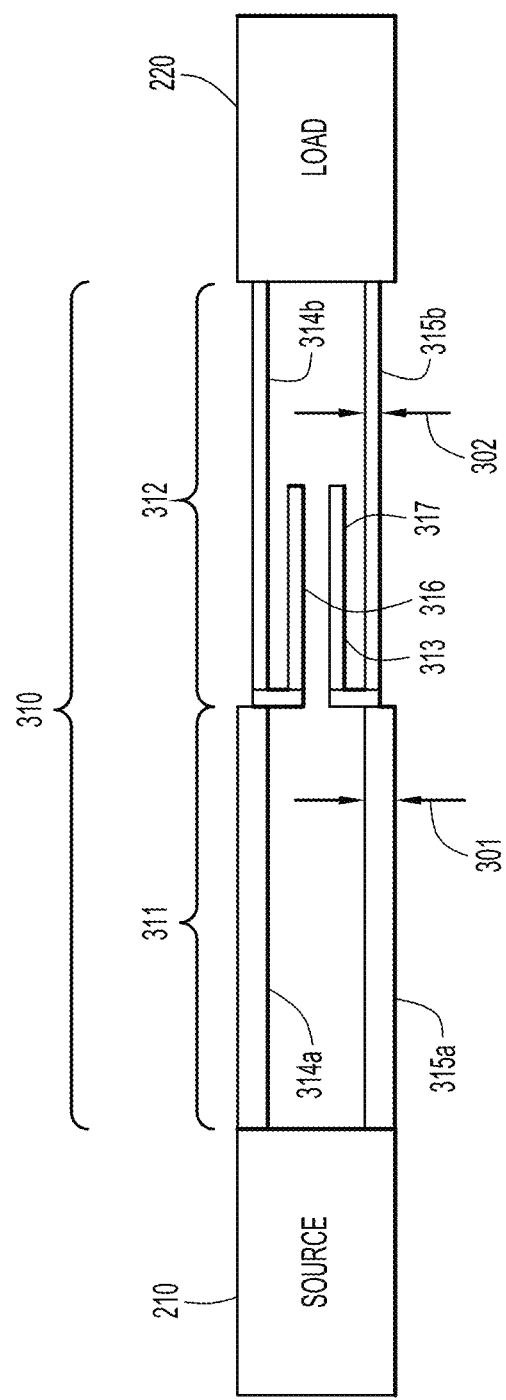
FIG. 3 illustrates an example differential transmission line for use between a source and a load.

Reference is now made to FIG. 3. As depicted in FIG. 3, the transmission line may comprise a differential signal transmission line 310. Differential signal transmission line 310 comprises a first portion 311 and a second portion 312. The differential signal transmission line 310 further comprises a first signal line 314a,b and a second signal line 315a,b. The first signal line 314a,b comprises a first portion 314a, and a second portion 314b. The first signal line 314a,b is allocated for a true signal. The second signal line 315a,b comprises a first portion 315a and a second portion 315b. The second signal line 314a,b is allocated for a complement signal.

Coupled between the first signal line 314a,b and the second signal line 315a,b is capacitor 313. According to the example of FIG. 3, capacitor 313 is a parallel plate capacitor with a first plate 316 electrically coupled to first signal line 314a,b and a second plate 317 electrically coupled to second signal line 315a,b.

Additionally, the differential first portion 311 and the differential second portion 312 are arranged such that a difference between the internal capacitance of the differential first portion 311 and the differential second portion 312 is equal to a capacitance of the capacitor 330.

A difference between the internal capacitance of the differential first portion 311 and the differential second portion 312 may be achieved by configuring the differential first portion 311 and differential second portion 312 to be different in at least one physical dimension. For example, in FIG. 3, a width 301 of the first portion 314a and first portion 315a is greater than a width 302 of second portion 314b and the second portion 315b, similar to that depicted in FIG. 2. Specifically, the differential first portion 311 of the transmission line may be constructed with a standard width 301 which exhibits a standard characteristic impedance for a specific interface technology. The differential second portion 312, on the other hand, may have a width 302 such that the internal capacitance of the differential second portion 312 plus the capacitance of the capacitor 330 matches the internal capacitance of differential first portion 311.

According to a different example, the difference in capacitance between differential first portion 311 and differential second portion 312 may be achieved by selecting a distance between first portion 314a and first portion 315a that is different from a distance between second portion 314b and second portion 315b. Alternatively, the difference in capacitance may be achieved by placing a dielectric material between first portion 314a and first portion 315a and/or placing another dielectric material between second portion 314b and second portion 315b.

The capacitance of capacitor 313 may be determined by configuring the physical dimensions of first plate 316 and second plate 317. For example, the length and width of first plate 316 and second plate 317 may be selected to match the determined impedance difference. Alternatively, a dielectric material may be placed between first plate 316 and second plate 317 of capacitor 313 in order to configure the capacitance of the capacitor 313 to match the determined impedance difference.

Figure 4:
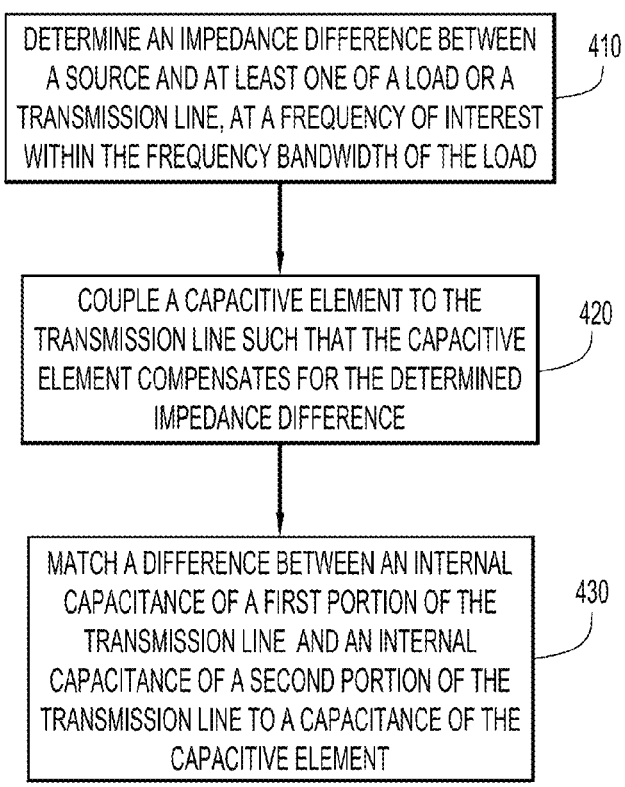
FIG. 4 is a flowchart illustrating an example method of designing a transmission line.

Turning to FIG. 4, a flowchart 400 is shown depicting a method for constructing a transmission line according to the techniques described herein. The method begins in step 410 where an impedance difference between a load and at least one of a source or a transmission line is determined at a frequency of interest which is within the frequency bandwidth of the load. For example, the frequency of interested may be between the Nyquist frequency and the upper operating frequency of a broadband signal, a baseband signal, or of the load. For example, the frequency of interest may be a frequency greater than or equal to the Nyquist frequency of a broadband or baseband interface. According to other examples, the frequency of interest may be a frequency slightly less than the Nyquist frequency. Accordingly, the frequency of interest may be chosen to be a value between 90% of the Nyquist frequency and the upper operating frequency. For example, the frequency of interest may be chosen to have a value 95% of the Nyquist frequency.

The impedance difference may be calculated between the source and the load, the source and the transmission line, or some combination thereof. When determining the impedance difference based on the transmission line, a standard characteristic impedance for a specific interface technology may be used as the impedance of the transmission line. Alternatively, the impedance may be calculated according to the highest impedance that may be manufactured in a substrate for a specific transmission line application. For example, the impedance may be calculated according to the highest impedance that may be manufactured in a substrate for a broadband interface or receiver application.

In order to determine the impedance difference between the load and at least one of the source or the transmission line, a parasitic input capacitance and a complex reflection coefficient may be calculated for the load.

In step 420, a location is determined for inserting a capacitive element along the transmission line such that the capacitive element compensates for the determined impedance difference at the frequency of interest. In step 420, the location at which to insert the capacitive element may be determined by determining a location along the transmission line that has an imaginary complex reflection coefficient equal in magnitude to the complex reflex coefficient of the load, but that has an imaginary component with a sign opposite to the sign of the imaginary component of the complex reflection coefficient of the load.

The complex reflection coefficient for the location along the transmission line for the capacitive element may be determined by performing a Smith Chart analysis for the source, transmission line, and load system. Specifically the Smith Chart analysis may include taking the parasitic input capacitance and the complex reflection coefficient as determined in step 410, and locating the point corresponding to these values in a Smith Chart. A second point within the Smith Chart is determined by the degrees of phase required to reflect the parasitic input capacitance and the complex reflection coefficient about the real axis of the Smith Chart. This second point will have a reflection coefficient with the same magnitude as the previously determined reflection coefficient, but the imaginary component has the opposite sign. Effectively, the second point represents a location along the transmission line where the input parasitic capacitance appears inductive. The location along the transmission line represented by the second point is where the capacitive element may be located.

Determining the location at which to couple the capacitive element to the transmission line may further include selecting the type of capacitive element, such as an open transmission line stub. Alternatively, if the transmission line comprises a differential signaling line, the capacitive element may comprise a capacitor. Specifically, if the capacitor comprises a parallel plate capacitor, one plate may be electrically coupled to the true signaling line, while the second plate may be electrically coupled to the complement signaling line.

In step 430, a difference between an internal capacitance of a first portion of the transmission line and an internal capacitance of a second portion of the transmission line is matched to the capacitance of the capacitive element. The difference between the internal capacitance of the first portion of the transmission line may be matched to the second portion of the transmission line by determining at least one physical difference between the first portion of the transmission line and the second portion of the transmission line. For example, the width of the first portion of the transmission line may be different than a width of the second portion of the transmission line. Alternatively, if the transmission line comprises a differential signal transmission line, a distance between the true transmission line and the complement transmission line may be different for the first portion of the transmission line than it is for the second portion of the transmission line. According to another alternative, a material, such as a dielectric material, may be positioned between at least one of the first and/or second portions of the transmission line in order to match the difference between the internal capacitances of the first and second portions of the transmission line to the capacitance of the capacitive element.

Furthermore, the first and second portions of the transmission lines may be determined such that the capacitive element is located at a transition between the first and second portions of the transmission line. Alternatively, the first and second portions of the transmission line may be determined such that the capacitive element may be located within the second portion of the transmission line, at a location between the transition from the first portion to the second portion, and the load.

Figure 5:
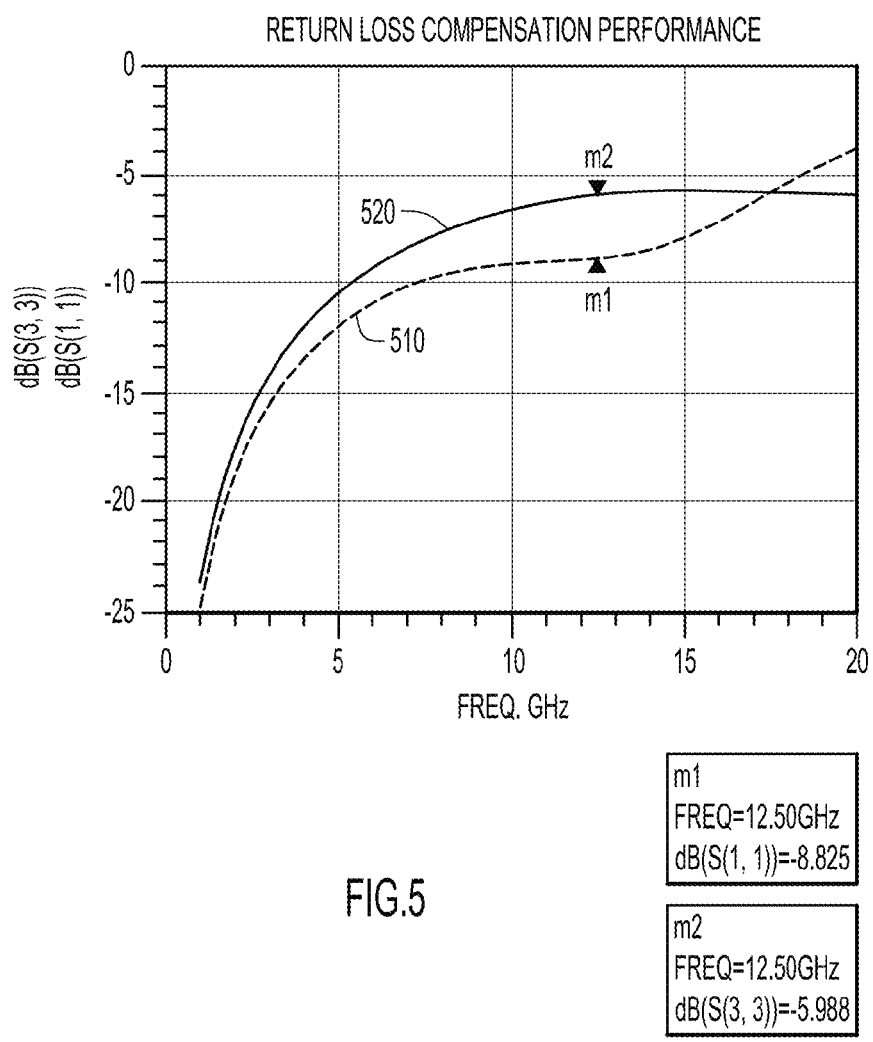
FIG. 5 is a graph illustrating the improved return loss of an example transmission line compared to that of a standard transmission line.

Turning to FIG. 5, depicted therein is a graph illustrating the benefits of a specific example transmission line 510 compared to a standard transmission line 520, both implemented in a baseband interface. The baseband interface of the example shown in FIG. 5 operates at 25 Gbps, though other examples may be implemented in 28 Gbps interfaces and 50 Gbps interface, as well as interfaces operating in excess of 50 Gbps. As shown in FIG. 5, the return loss compensation performance is shown for the example transmission line 510 and the standard transmission line 520, operating over a frequency range of 1-20 GHz. According to the example, the Nyquist frequency of the interface is 12.50 GHz. At the Nyquist frequency, the example transmission line 510 shows approximately 3 dB of improvement over the standard transmission line 520. Additionally, the example transmission line 510 shows at least some return loss compensation performance improvement across a frequency range from 1 to more than 16 GHz.

Figure 6:
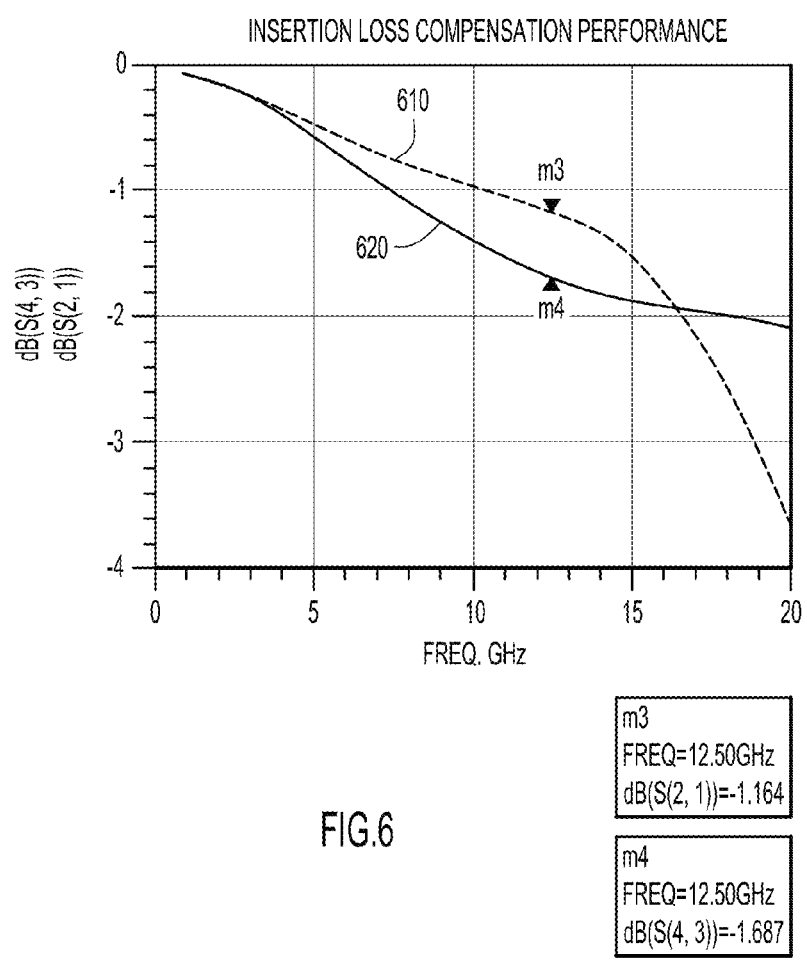
FIG. 6 is a graph illustrating the improved insertion loss of an example transmission line compared to that of a standard transmission line.

FIG. 6 is similar to FIG. 5 in that it also illustrates significant performance gains for a specific example transmission line 610 over a standard transmission line 620, both implemented in a baseband interface. As shown in FIG. 6, the example transmission line 610 shows improved insertion loss performance by more than 2 dB at the Nyquist frequency of 12.50 GHz, and at least some improvement over a frequency range of 3 to more than 16 GHz.

Accordingly, presented herein are techniques by which transmission lines may be used to implement passive input compensation circuits that improve the return and insertion loss performance of high frequency broadband interfaces. Therefore, the transmission lines can allow for a good broadband match, as may be necessary for digital communication applications.

The above description is intended by way of example only.

What is claimed is:

1. An apparatus comprising:
   a package substrate, and
   a transmission line arranged within the package substrate, the transmission line comprising a first portion connected to a source, a second portion connected to a load: and
   a capacitive element configured to compensate for an impedance difference between the load and at least one of the source or the transmission line, at a frequency greater than or equal to a Nyquist frequency of a baseband signal modulated for transmission over the transmission line,
   wherein a difference between an internal capacitance of the first portion of the transmission line and an internal capacitance of the second portion of the transmission line substantially matches the capacitance of the capacitive element.

2. The apparatus of claim 1, wherein the capacitive element is coupled to the transmission line at a transition between the first portion of the transmission line and the second portion of the transmission line.

3. The apparatus of claim 1, wherein the capacitive element comprises an open transmission line stub.

4. The apparatus of claim 1, wherein the transmission line comprises a differential signal transmission line comprising a first signal line allocated to a true signal and a second signal line allocated to a complement signal, and
   wherein the capacitive element comprises a parallel plate capacitor comprising a first plate electrically coupled to the first signal line and a second plate electrically coupled to the second signal line.

5. An apparatus comprising:
   a transmission line comprising a first portion and a second portion, the first portion configured to be connected to a source and the second portion configured to be connected to a load; and
   a capacitive element coupled to the transmission line and configured to compensate for an impedance difference between the load and at least one of the source or the transmission line, at a frequency within a frequency bandwidth of the load; and
   wherein a difference between an internal capacitance of the first portion of the transmission line and an internal capacitance of the second portion of the transmission line substantially matches the capacitance of the capacitive element.

6. The apparatus of claim 5, wherein the transmission line comprises a differential signal transmission line having a first signal line allocated for a true signal and a second signal line allocated for a complement signal, and the capacitive element comprises a capacitor coupled between the first signal line and the second signal line.

7. The apparatus of claim 6, wherein the capacitor further comprises a dielectric material.

8. The apparatus of claim 5, wherein the capacitive element is coupled to the transmission line at a transition between the first portion of the transmission line and the second portion of the transmission line.

9. The apparatus of claim 5, wherein the capacitive element is coupled to the second portion of the transmission line.

10. The apparatus of claim 5, wherein the capacitive element comprises an open transmission line stub.

11. The apparatus of claim 5, wherein the first portion of the transmission line comprises a first width and the second portion of the transmission comprises a second width, and wherein a difference between the first width and the second width is configured to create the difference between the internal capacitance of the first portion of the transmission line and the internal capacitance of the second portion of the transmission line.

12. The apparatus of claim 5, wherein the first portion of the transmission line differs from the second portion of the transmission in at least one physical dimension so as to create the difference between the internal capacitance of the first portion of the transmission line and the internal capacitance of the second portion of the transmission line.

13. The apparatus of claim 5, wherein the frequency is greater than or equal to a Nyquist Frequency of a baseband signal modulated for transmission over the transmission line.

14. The apparatus of claim 5, wherein the first and second portions of the transmission line are configured to operate in a baseband frequency range.

15. The apparatus of claim 5, wherein the first and second portions of the transmission line are configured to operate in a broadband frequency range.

16. A method comprising:
    determining an impedance difference between a load and at least one of a source or a transmission line of an interface, at a frequency of interest within a frequency bandwidth of the load;
    determining a location to couple a capacitive element to the transmission line such that the capacitive element compensates for the determined impedance difference at the frequency of interest;
    matching a difference between an internal capacitance of a first portion of the transmission line and an internal capacitance of a second portion of the transmission line to a capacitance of the capacitive element.

17. The method of claim 16, wherein determining the impedance difference comprises determining a parasitic input capacitance and a first complex reflection coefficient of the load at the frequency of interest.

18. The method of claim 17, wherein determining the location comprises coupling the capacitive element at a position on the transmission line having a second complex reflection coefficient equal in magnitude to the first complex reflection coefficient and having an imaginary component with a sign opposite to a sign of an imaginary component of the first complex reflection coefficient.

19. The method of claim 18, wherein determining the location further comprises determining the position on the transmission line having the second complex reflection coefficient through Smith Chart analysis.

20. The method of claim 17, wherein determining the impedance difference comprises determining the parasitic input capacitance for the transmission line having a highest impedance that can be manufactured in a substrate of an interface.

21. The method of claim 16, wherein determining the impedance differences comprises determining the frequency difference at a frequency greater than or equal to a Nyquist frequency of a baseband signal modulated for transmission over the transmission line.

22. The method of claim 16, wherein matching comprises setting a first width for the first portion and a second width for the second portion.

23. The method of claim 16, wherein determining the location comprises coupling the capacitive element at a transition from the first portion to the second portion.

24. The method of claim 16, wherein determining the location comprises coupling the capacitive element to the second portion.

25. The method of claim 16, further comprising selecting a dielectric material for the capacitive element.

* * * * *